United States Patent
Lu et al.

(10) Patent No.: US 9,921,610 B2
(45) Date of Patent: Mar. 20, 2018

(54) PORTABLE ELECTRONIC DEVICE HAVING SUPPORTER

(71) Applicants: Ming-Shun Lu, Taipei (TW); Ming-Chung Liu, Taipei (TW); Kun-Hsin Liu, Taipei (TW); Yun Bai, Taipei (TW); Yu-Wen Cheng, Taipei (TW)

(72) Inventors: Ming-Shun Lu, Taipei (TW); Ming-Chung Liu, Taipei (TW); Kun-Hsin Liu, Taipei (TW); Yun Bai, Taipei (TW); Yu-Wen Cheng, Taipei (TW)

(73) Assignee: COMPAL ELECTRONICS, INC., Taipei (TW)

( * ) Notice: Subject to any disclaimer, the term of this patent is extended or adjusted under 35 U.S.C. 154(b) by 0 days.

(21) Appl. No.: 15/272,444

(22) Filed: Sep. 22, 2016

(65) Prior Publication Data
US 2017/0090522 A1   Mar. 30, 2017

Related U.S. Application Data

(60) Provisional application No. 62/232,421, filed on Sep. 24, 2015.

(51) Int. Cl.
| G06F 1/16 | (2006.01) |
| H05K 5/00 | (2006.01) |
| H05K 5/02 | (2006.01) |
| H04M 1/02 | (2006.01) |

(52) U.S. Cl.
CPC .......... G06F 1/1679 (2013.01); G06F 1/1616 (2013.01); H05K 5/0086 (2013.01); H05K 5/0217 (2013.01); H04M 1/0214 (2013.01)

(58) Field of Classification Search
CPC .. G06F 1/1616; G06F 1/1679; H04M 1/0214; H05K 5/0086; H05K 5/0217
See application file for complete search history.

(56) References Cited

U.S. PATENT DOCUMENTS

| 8,599,542 B1 * | 12/2013 | Healey ................. G06F 1/1626 345/168 |
| 9,072,174 B2 * | 6/2015 | Lin .......................... H05K 7/02 |
| 2014/0104782 A1 * | 4/2014 | Lin .......................... H05K 7/02 361/679.44 |

(Continued)

Primary Examiner — James Wu
(74) Attorney, Agent, or Firm — JCIPRNET

(57) ABSTRACT

A portable electronic device includes first body and second body pivoted to the first body. The first body includes casing, supporter, first magnetic component and torsion component. The casing includes accommodating trench and first trench. First lateral of the supporter is pivoted to the casing via the torsion component, and second lateral of the supporter includes notch. When the supporter is located in the accommodating trench and the first magnetic component extends into the notch, the supporter is positioned inside the accommodating trench by the first magnetic component, and the torsion component stores elastic potential energy. When the second body rotates close to the first body, the first magnetic component exits the notch due to magnetic repulsive force of second magnetic component of the second body, and the torsion component releases the elastic potential energy so that the second lateral of the supporter rotates out to support the second body.

13 Claims, 18 Drawing Sheets

(56) References Cited

U.S. PATENT DOCUMENTS

2016/0179142 A1* 6/2016 Liang .................... G06F 1/1656
  361/679.17
2016/0370826 A1* 12/2016 Wang .................... G06F 1/1632

* cited by examiner

PORTABLE ELECTRONIC DEVICE HAVING SUPPORTER

CROSS-REFERENCE TO RELATED APPLICATION

This application claims the priority benefits of U.S. provisional application Ser. No. 62/232,421, filed on Sep. 24, 2015. The entirety of the above-mentioned patent application is hereby incorporated by reference herein and made a part of this specification.

BACKGROUND OF THE INVENTION

1. Field of the Invention

The present invention relates to an electronic device, and more particularly, to a portable electronic device.

2. Description of Related Art

Currently, the notebook with two bodies able to be respectively pivoted and a pivot angle close to 360 degrees is already on the market, and the notebook can provide functions of a normal notebook, or, functions of a tablet PC. As a tablet PC, if it can stand with a particular angle, the tablet PC can be more convenient for the user to view or operate. However, the user needs to carry a supporter in addition, so that it is inconvenient for user when the tablet PC is being carried.

SUMMARY OF THE INVENTION

The present invention provides a portable electronic device, which has a supporter able to support the second body.

A portable electronic device of the invention includes a first body and a second body. The first body includes a casing, a supporter, a first magnetic component, and a torsion component. The casing includes a first surface, an accommodating trench sunk into the first surface, and a first trench communicated with the accommodating trench. The supporter includes a first lateral and a second lateral opposite to each other, wherein the first lateral is pivoted to the casing through the torsion component, the supporter is adapted to be accommodated in the accommodating trench, and the second lateral comprises a notch. The first magnetic component is slidably disposed on the first trench and adapted to extend into the notch. The second body is pivoted to the first body and includes a second magnetic component. When the supporter is located in the accommodating trench and the first magnetic component extends into the notch, the supporter is positioned inside the accommodating trench by the first magnetic component, and the torsion component stores an elastic potential energy. When the second body is rotated close to the first surface of the first body, the first magnetic component exits the notch due to a magnetic repulsive force of the second magnetic component so that the supporter is not positioned by the first magnetic component, and the torsion component releases the elastic potential energy so that the second lateral of the supporter is rotated out to support the second body.

In an embodiment of the invention, the first body further includes a third magnetic component, disposed on the supporter and close to the notch, the third magnetic component is adapted to magnetically attract the first magnetic component so that the first magnetic component extends into the notch.

In an embodiment of the invention, the first body further includes a third magnetic component, disposed in the casing and close to the accommodating trench, the third magnetic component is adapted to magnetically attract the first magnetic component so that the first magnetic component extends into the notch.

In an embodiment of the invention, the first body further includes an elastic component, disposed in the first trench and linked to the first magnetic component, the first magnetic component is adapted to compress the elastic component so as to exit the notch.

In an embodiment of the invention, the casing includes a second trench communicated with the first trench, the first body further includes a stopper, slidably disposed on the second trench and adapted to extend into the first trench to restrict a sliding space of the first magnetic component inside the first trench so as to prevent the first magnetic component from exiting the notch.

In an embodiment of the invention, the first magnetic component includes a cavity, and the stopper is adapted to extend into the cavity.

In an embodiment of the invention, a portion of the stopper extending into the first trench has a lead angle.

In an embodiment of the invention, the second lateral of the supporter includes a slip-stopping portion.

In an embodiment of the invention, the first lateral of the supporter or the casing at a position close to where the first lateral of the supporter is pivoted to the casing includes a position-limiting portion, so as to restrict a rotation range of the supporter relative to the casing.

In an embodiment of the invention, when the second lateral of the supporter rotates out of the accommodating trench and supports the second body, an angle between the first body and the second body is between 17 degrees and 22 degrees, and an angle between the supporter and the second body is between 85 degrees and 95 degrees.

In an embodiment of the invention, the first body includes a second surface opposite to the first surface, the first body is adapted to be rotated relative to the second body, so that the second surface of the first body contacts the second body.

In an embodiment of the invention, the first lateral of the supporter is closer to a pivot pivoted to the first body and the second body in comparison with the second lateral, or, the first lateral of the supporter is further away from the pivot pivoted to the first body and the second body in comparison with the second lateral.

In an embodiment of the invention, the second lateral of the supporter is rotated out in a clockwise direction, or, the second lateral of the supporter is rotated out in a counter-clockwise direction.

Based on the above, the first body of the portable electronic device of the invention includes a supporter pivoted to the casing through the torsion component, a first magnetic component able to extend into the notch of the supporter, and the second body includes the second magnetic component. When the supporter is located in the accommodating trench and the first magnetic component of the first body extends into the notch of the supporter, the supporter is positioned inside the accommodating trench by the first magnetic component, and the torsion component stores elastic potential energy. When the supporter is going to be rotated out, as long as the second body is rotated close to the first surface of the first body, and the first magnetic component exits the notch due to a magnetic repulsive force of the second magnetic component so that a position-limiting relationship between the first magnetic component and the supporter is removed, then the torsion component can consequently release the elastic potential energy so that the second lateral of the supporter is rotated out to support the second body.

To make the above features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
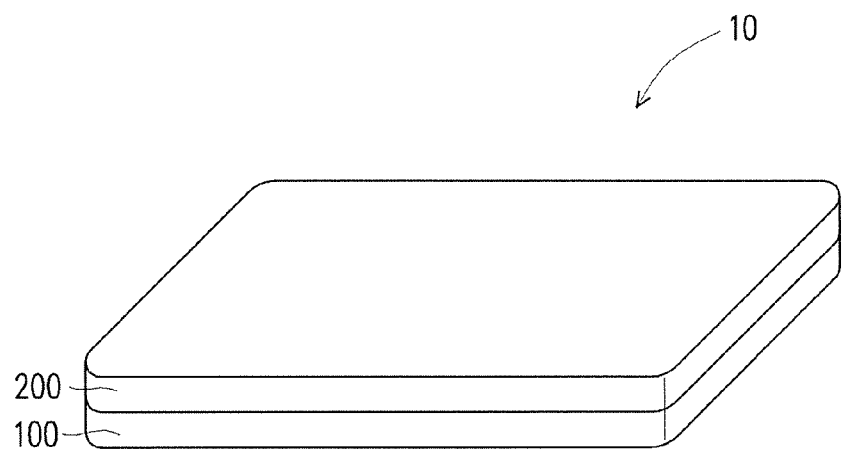
FIG. 1A is a three-dimensional schematic view of a portable electronic device according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1A is a three-dimensional schematic view of a portable electronic device 10 according to an embodiment of the present invention. Please referring to FIG. 1A, the portable electronic device 10 includes a first body 100 and a second body 200 able to be rotated relative to the first body 100. The first body 100 is a body including an input module 116 (illustrated in FIG. 1B) and a mainboard (not shown), for example, and the second body 200 is a body including the display module 220, for example. In the embodiment, the portable electronic device 10 is a notebook PC, for example. More specifically, the portable electronic device 10 is a portable electronic device with a second body 200 able to be rotated relative to the first body 100 in an angle close to 360 degrees. The input module 116 is a keyboard, and the display module 220 is a touch panel, for example, but the species of the input module 116 and the display module 220 is not limited thereto.

Figure 1B:
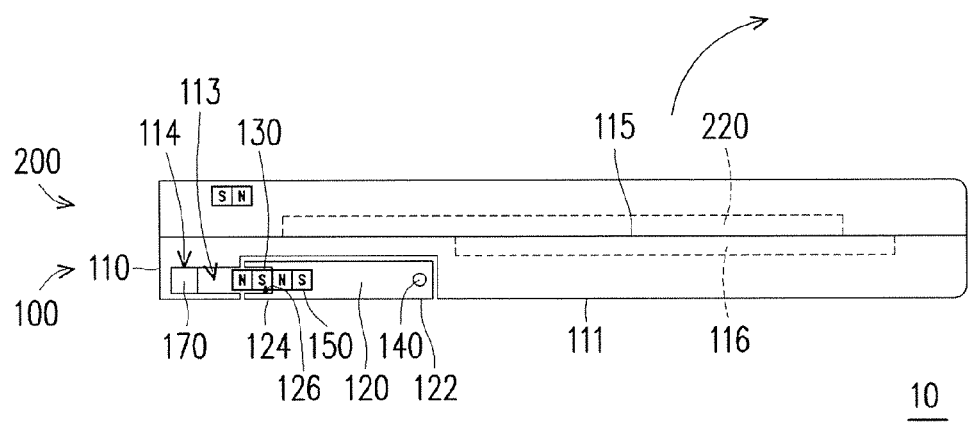
FIG. 1B is a cross-sectional schematic view of a portable electronic device according to FIG. 1A.

FIG. 1B is a cross-sectional schematic view of the portable electronic device 10 according to FIG. 1A. Please referring to FIG. 1B, in the embodiment, the first body 100 includes a first surface 111 and a second surface 115 opposite to each other. The input module 116 is exposed at the second surface 115. As shown in FIG. 1B, in the case of the normal closed state, the first body 100 contacts the desk-top (not shown) with the first surface 111, and the display module 220 of the second body 200 contacts or approaches the second surface 115 of the first body 100. When the user is using the portable electronic device 10, the second body 200 can be turned over and used as a normal notebook PC.

Figure 1C:
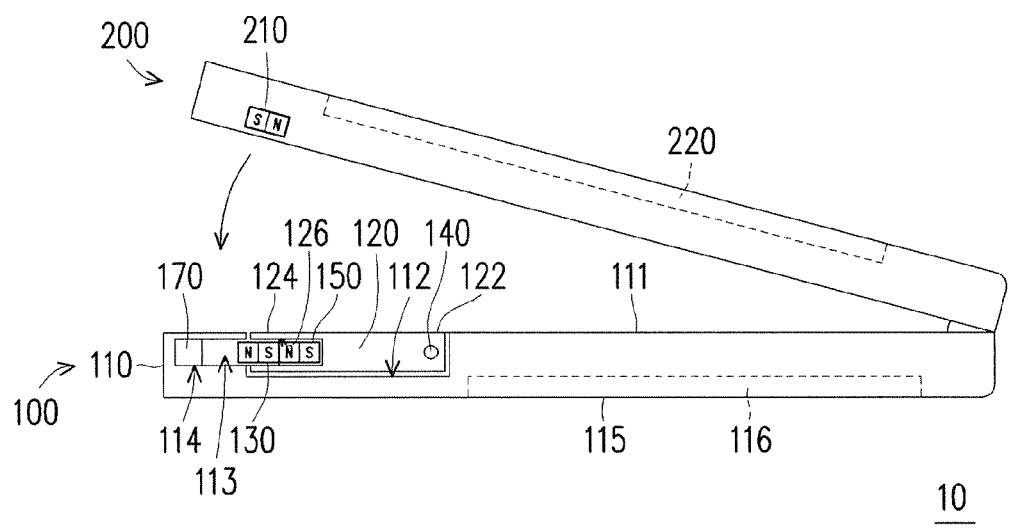
FIG. 1C to FIG. 1F are cross-sectional schematic views of the operation of the supporter according to the portable electronic device in FIG. 1A in the process of rotation.

When the user wants to use the portable electronic device 10 as a panel PC, the second body 200 can be rotated into the position illustrated in FIG. 1C, in this case, the first body 100 contacts the desk-top with the second surface 115 instead. If the user-friendly viewing is concerned, the second body 200 is preferably able to stand with a particular angle. The portable electronic device 10 in the embodiment has a special design, so that in the process of the second body 200 being rotated by the user, the supporter 120 can be rotated out automatically and supports the second body 200, so as to make the second body 200 able to be supported in a particular angle. The circumstance will be further illustrated in the following paragraph.

FIG. 1C to FIG. 1F are cross-sectional schematic views of the operation of the supporter 120 according to the portable electronic device 10 in FIG. 1A in the process of rotation. Please referring to FIG. 1C, the first body 100 of the embodiment includes a casing 110, a supporter 120, a first magnetic component 130, a third magnetic component 150, and a torsion component 140. The second body 200 includes a second magnetic component 210, close to the surface opposite to the display module 220.

The casing 110 of the first body 100 includes an accommodating trench 112 sunk into the first surface 111 and a first trench 113 communicated with the accommodating trench 112. The supporter 120 includes a first lateral 122 and a second lateral 124 opposite to each other, and the first lateral 122 is pivoted to the portion of the casing 110 close to the accommodating trench 112 through the torsion component 140. The supporter 120 is adapted to be accommodated in the accommodating trench 112, and the second lateral 124 can also be rotated relative to the first lateral 122 and leaves the accommodating trench 112 (as illustrated in FIG. 1F). The second lateral 124 of the supporter 120 includes the notch 126. When the supporter 120 is accommodated in the accommodating trench 112, the notch 126 of the supporter 120 is communicated with the first trench 113. The third magnetic component 150 is disposed in the supporter 120 and close to the notch 126.

The first magnetic component 130 is slidably disposed on the first trench 113 and adapted to extend into the notch 126. As illustrated in FIG. 1C, the third magnetic component 150 is adapted to magnetically attract the first magnetic component 130, so that the first magnetic component 130 extends into the notch 126. Because the first magnetic component 130 is simultaneously located in the notch 126 of the supporter 120 and the first trench 113 of the casing 110, under this circumstance, the supporter 120 is positioned in the accommodating trench 112 and won't be rotated relative to the casing 110.

In the embodiment, the torsion component 140 is connected to the casing 110 and the first lateral 122 of the supporter 120. The torsion component 140 is torsion spring, for example, but the species of the torsion component 140 is not limited thereto. When the supporter 120 is accommodated in the accommodating trench 112, the torsion component 140 stores an elastic potential energy.

Figure 1D:
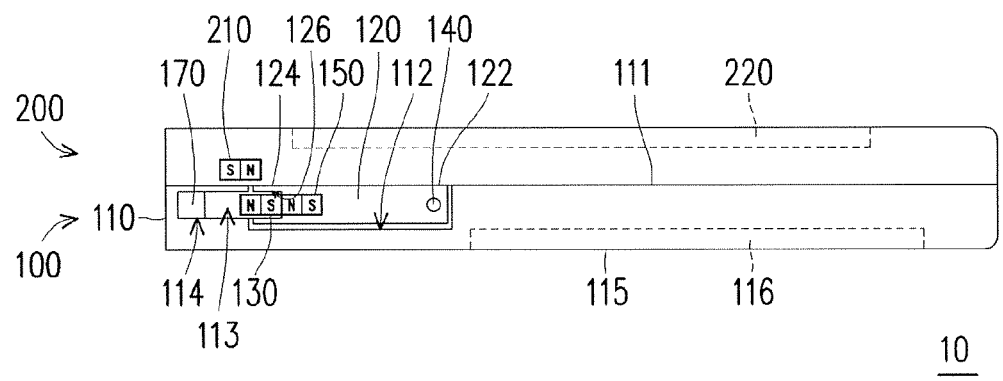
Figure 1E:
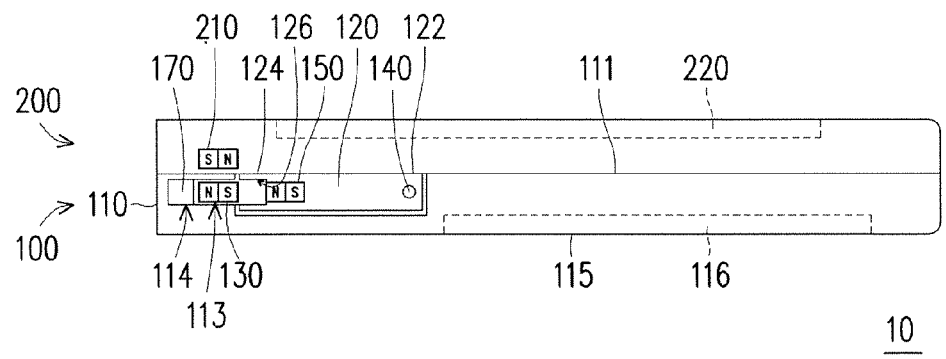
Figure 1F:
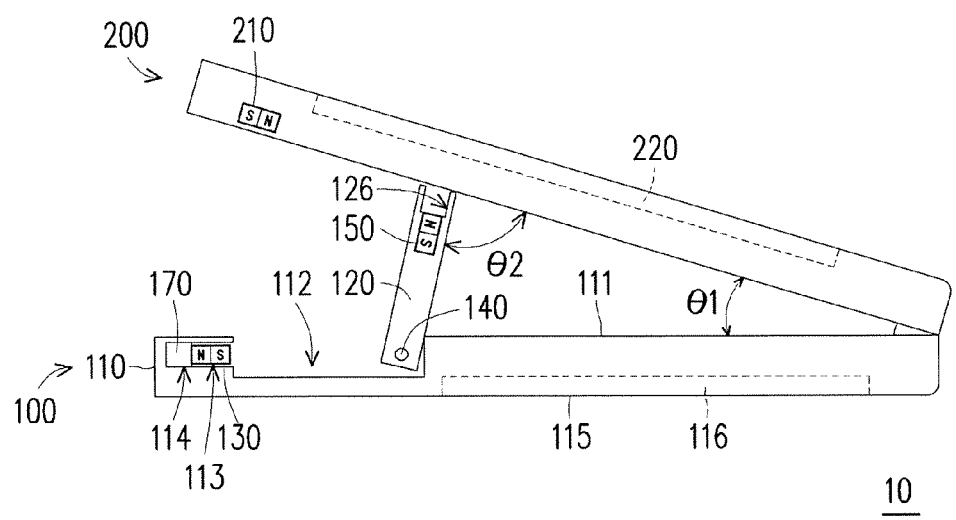

Please referring to FIG. 1D and FIG. 1E, when the second body 200 is rotated close to the first surface 111 of the first body 100, the first magnetic component 130 of the first body 100 exits the notch 126 due to a magnetic repulsive force of the second magnetic component 210 of the second body 200. At this time, because the first magnetic component 130 located in the first trench 113 won't interfere the supporter 120, as illustrated in FIG. 1F, the torsion component 140 release the elastic potential energy so that the second lateral 124 of the supporter 120 is rotated out to support the second body 200.

That is, the portable electronic device 10 of the embodiment moves the position of the first magnetic component 130 through magnetic repulsive force between the second magnetic component 210 of the second body 200 and the first magnetic component 130 of the first body 100, so that the first magnetic component 130 moves toward the inside of the first trench 113 and exits the supporter 120, as illustrated in FIG. 1D. Then, please referring to FIG. 1E, after the first magnetic component 130 exits the supporter 120, the first magnetic component 130 stays in the first trench 113 due to the magnetic attractive force of the second magnetic component 210, and the second lateral 124 of the supporter 120 is driven by the torsion component 140 and rotated out relative to the first body 100 to automatically supports the second body 200, so as to provide a comfortable using angle to the user.

In a preferred embodiment, when the second lateral 124 of the supporter 120 rotates out of the accommodating trench 112 and supports the second body 200, an angle θ1 between the first body 100 and the second body 200 is between 17 degrees and 22 degrees, and an angle θ2 between the supporter 120 and the second body 200 is between 85 degrees and 95 degrees. After testing, the angle ranges above can let the user use the second body 200 in a more comfortable state.

Figure 1G:
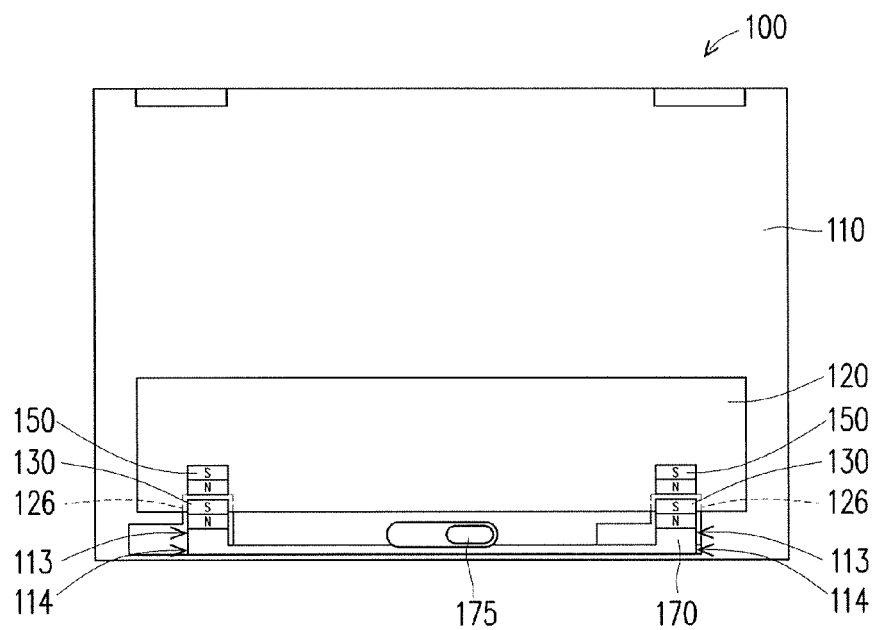
FIG. 1G to FIG. 1I are schematic views of the first magnetic component of the first body of the portable electronic device according to FIG. 1A being stopped, space-allowed, and moved by the stopper.
Figure 1H:
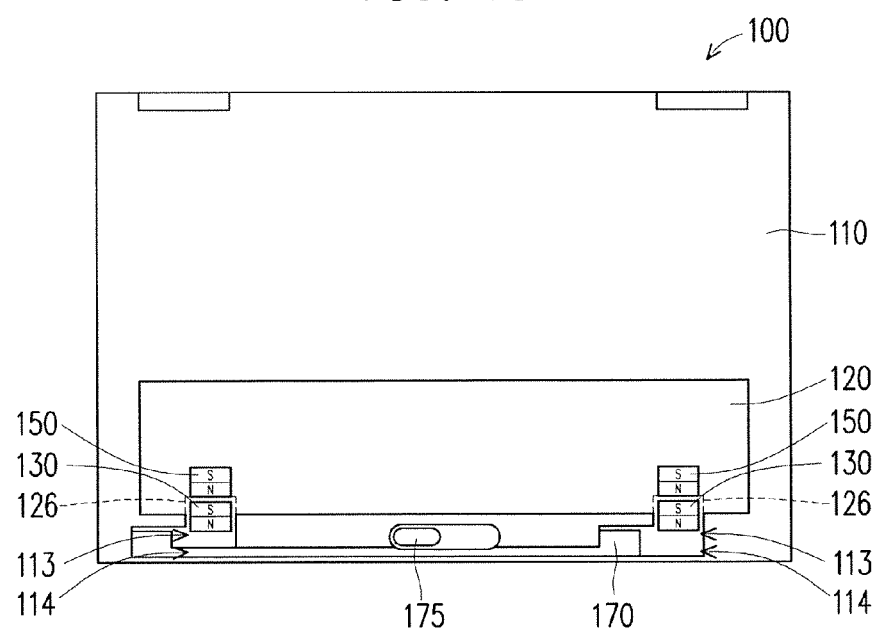
Figure 1I:
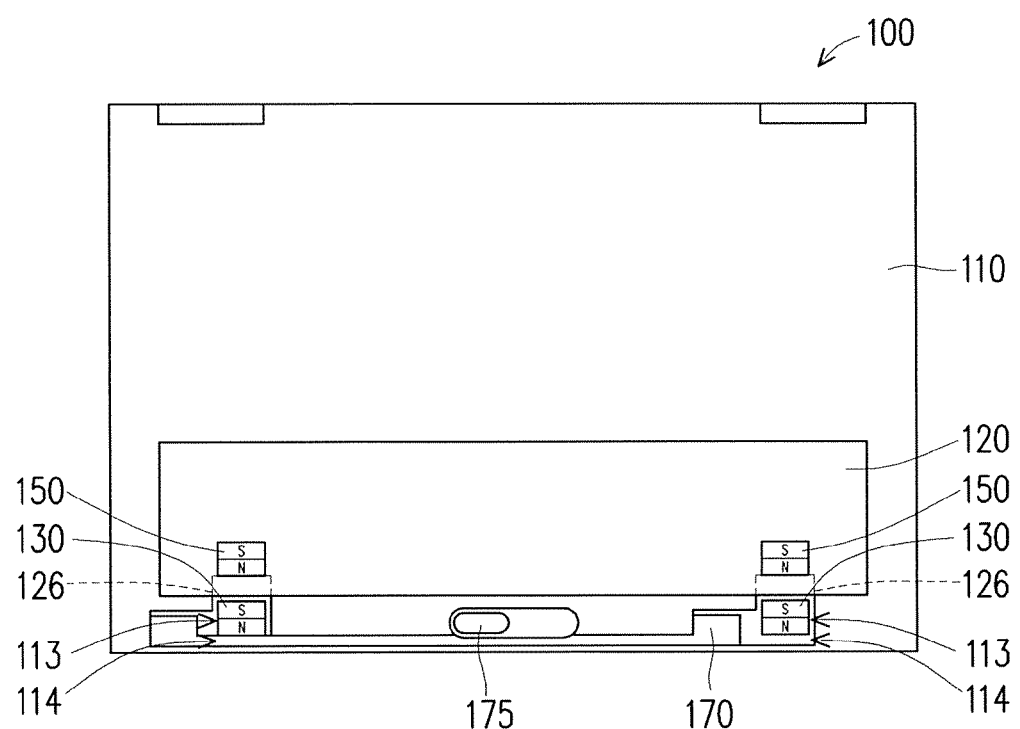

In addition, in the embodiment, to prevent the user from accidentally rotating out the supporter 120 while the user just want to flip the second body 200, the following mechanism is designed. FIG. 1G to FIG. 1I are schematic views of the first magnetic component of the first body of the portable electronic device according to FIG. 1A being stopped, space-allowed, and moved by the stopper. It should be noted that only the first body 100 is illustrated in FIG. 1G to FIG. 1I and the second body 200 is omitted, and the perspective in FIG. 1G to FIG. 1I is close to the top view of the first body 100 in FIG. 1C.

Please referring to FIG. 1G first, in the embodiment, the casing 110 includes a second trench 114 communicated with the first trench 113, and the first body 100 further includes two stoppers 170 connected to each other. In the embodiment, a button 175 is located between two stoppers 170 and linked to two stoppers 170. Of course, the number of the stoppers 170 can be one or more, and the location of the button 175 is not limited thereto, as long as it is able to be linked to the stopper 170.

In the embodiment, the stopper 170 is slidably disposed in the second trench 114 and adapted to be extended into the first trench 113, as illustrated in FIG. 1G. The thicker portion at both sides of the stopper 170 are extended into the first trenches 113 at the left side and right side respectively, so as to block a part of the sliding space of the first magnetic component 130 in the first trench 113. Therefore, in FIG. 1G, the first magnetic component 130 is restricted by the stopper 170 so that the first magnetic component 130 can't slide downwardly, and the first magnetic component 130 can't exit the notch 126 consequently.

Please referring to FIG. 1H and FIG. 1I, when the user needs to use the function of the supporter 120, as long as the button 175 is moved, the stopper 170 is moved accordingly, and the stopper 170 may exit the first trench 113. As a result, the first magnetic component 130 can move downward to exit the notch 126 of the supporter 120 consequently.

Of course, the mechanism controlling whether the supporter 120 is rotated out is not limited thereto, other embodiments will be illustrated in the following paragraph. It should be noted that in the embodiments below, the elements equal or similar to the previous embodiment are illustrated with the same or similar symbols. The following only illustrates the main differences between different embodiments, and the unnecessary details are not repeated herein.

FIG. 2A to FIG. 2D are cross-sectional schematic views of the operation of the supporter according to the portable electronic device of another embodiment of the invention in the process of rotation. Please referring to FIG. 2A to FIG. 2D, the main difference between the portable electronic devices 10a in FIG. 2A to FIG. 2D and the portable electronic devices 10 in FIG. 1C to FIG. 1F lies in the position of the third magnetic components 150, 150a. In the embodiment, the third magnetic component 150a is disposed in the casing 110 and close to the accommodating trench 112.

Figure 2A:
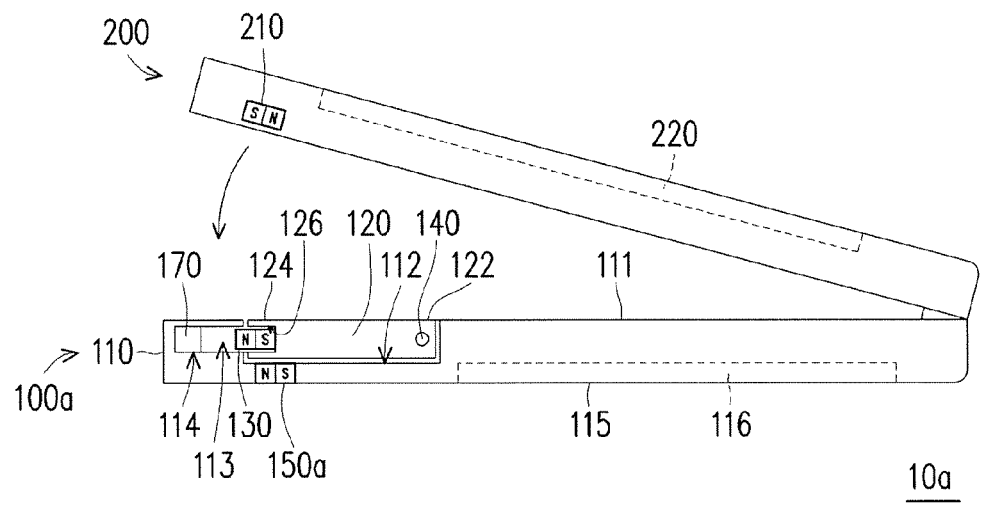
FIG. 2A to FIG. 2D are cross-sectional schematic views of the operation of the supporter according to the portable electronic device of another embodiment of the invention in the process of rotation.
Figure 2B:
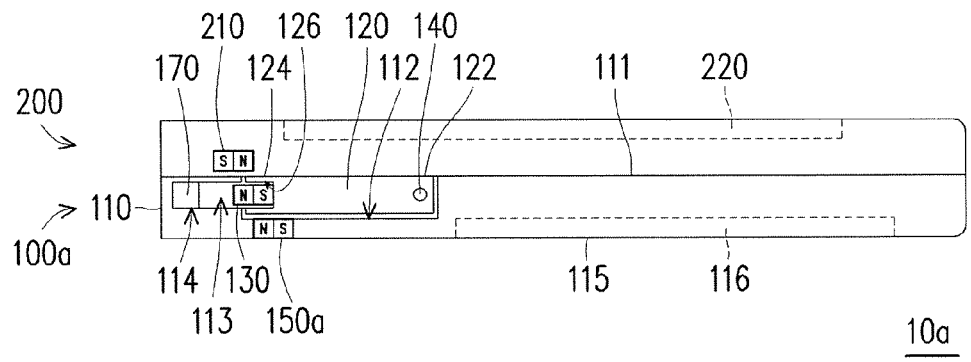
Figure 2C:
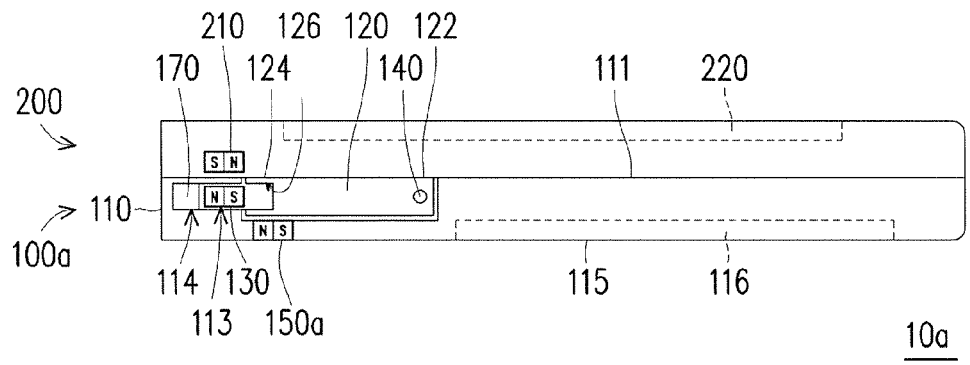
Figure 2D:
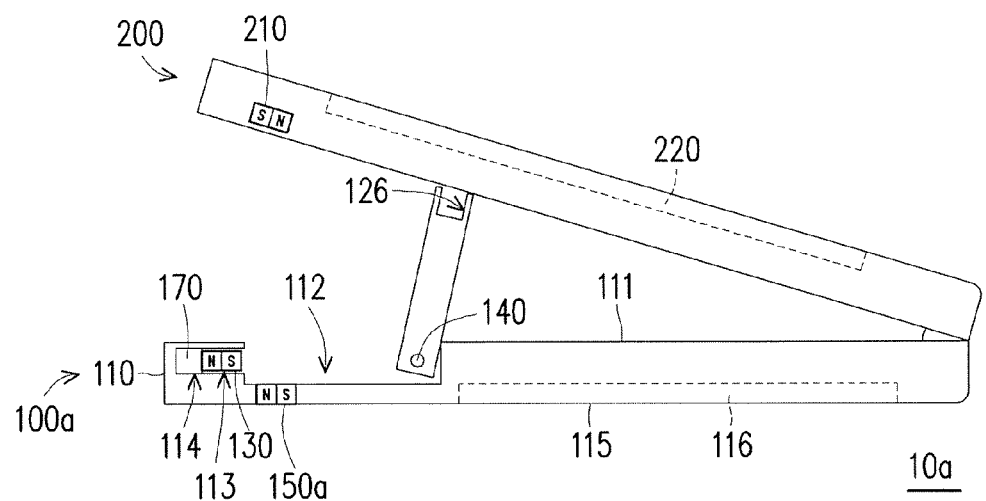

Similarly, as illustrated in FIG. 2A, the third magnetic component 150a will magnetically attract the first magnetic component 130, so that the first magnetic component 130 extends into the notch 126. As illustrated in FIG. 2B and FIG. 2C, when the second body 200 approaches the first surface 111 of the first body 100a, the magnetic repulsive force between the second magnetic component 210 of the second body 200 and the first magnetic component 130 of the first body 100a makes the first magnetic component 130 move toward the first trench 113, the first magnetic component 130 exits the notch 126 of the supporter 120, and after the first magnetic component 130 exits the supporter 120, the first magnetic component 130 still stays in the first trench 113 due to the magnetic attractive force of the second magnetic component 210. The second lateral 124 of the supporter 120 not interfered by the first magnetic component 130 receives the torsional force of the torsion component 140 and is rotated out to support the second body 200.

FIG. 3A to FIG. 3D are cross-sectional schematic views of the operation of the supporter according to the portable electronic device of another embodiment of the invention in the process of rotation. Please referring to FIG. 3A to FIG. 3D, the main difference between the portable electronic devices 10b in FIG. 3A to FIG. 3D and the portable electronic devices 10 in FIG. 1C to FIG. 1F lies in that, in the embodiment, the first body 100b is not configured with the third magnetic component, and the first body 100b further includes an elastic component 160b. The elastic component 160b is disposed in the first trench 113 and linked to the first magnetic component 130.

Figure 3A:
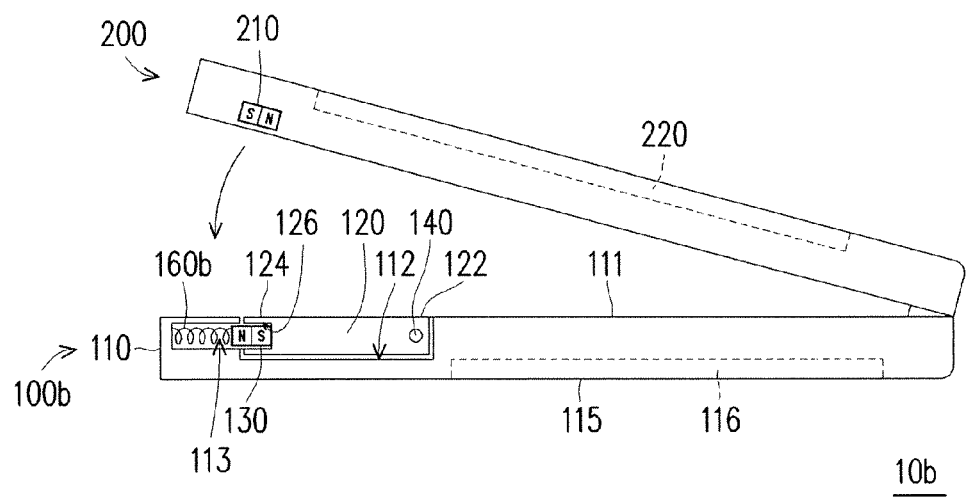
FIG. 3A to FIG. 3D are cross-sectional schematic views of the operation of the supporter according to the portable electronic device of another embodiment of the invention in the process of rotation.
Figure 3B:
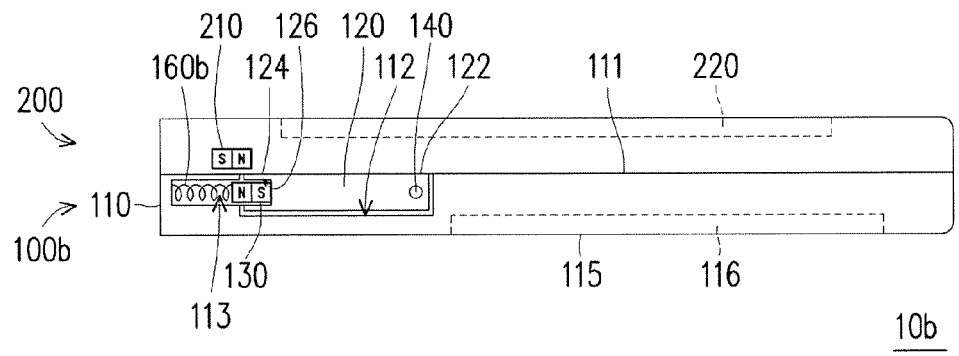
Figure 3C:
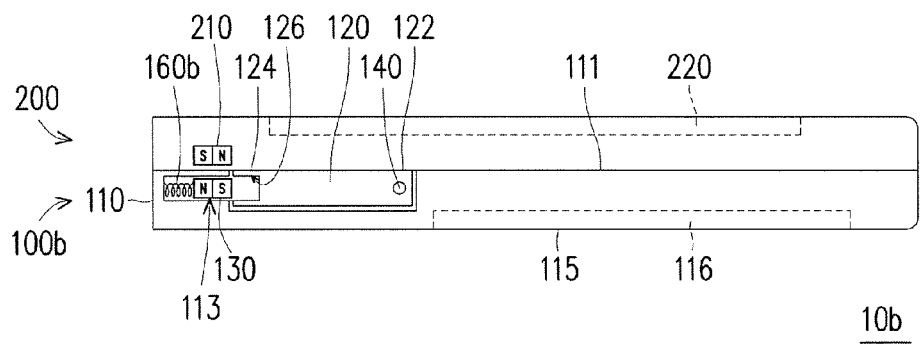
Figure 3D:
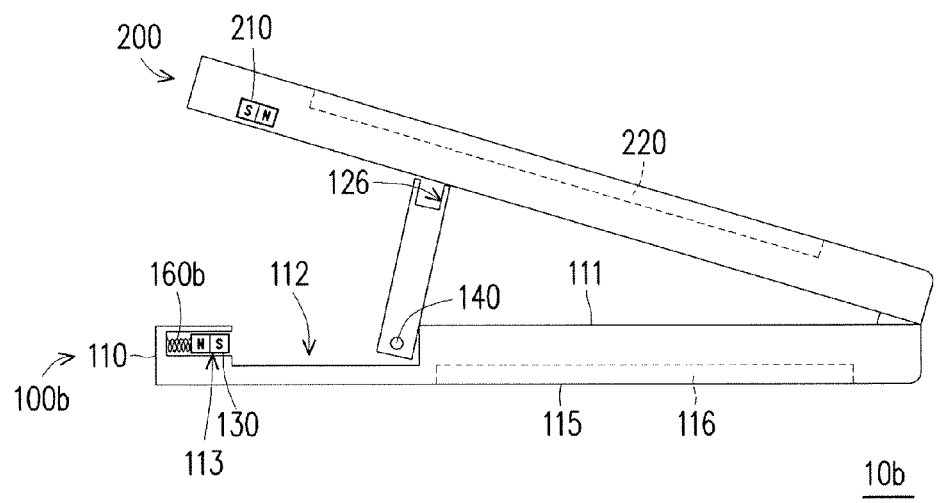

In FIG. 3A, the first magnetic component 130 extends into the notch 126 to fix the supporter 120 due to the elastic force of the elastic component 160b. As illustrated in FIG. 3B and FIG. 3C, when the second body 200 approaches the first surface 111 of the first body 100b, the magnetic repulsive force between the second magnetic component 210 of the second body 200 and the first magnetic component 130 of the first body 100b makes the first magnetic component 130 move toward the first trench 113, the first magnetic component 130 compresses the elastic component 160b so as to exit the notch 126 of the supporter 120, and after the first magnetic component 130 exits the supporter 120, the first magnetic component 130 stays in the first trench 113 due to the magnetic attractive force of the second magnetic component 210. The supporter 120 not interfered by the first magnetic component 130 receives the torsional force of the torsion component 140 and is rotated out to support the second body 200. It should be noted that in the embodiment, the magnetic repulsive force between the second magnetic component 210 of the second body 200 and the first magnetic component 130 of the first body 100b is greater than the elastic force of the elastic component 160b.

Figure 4A:
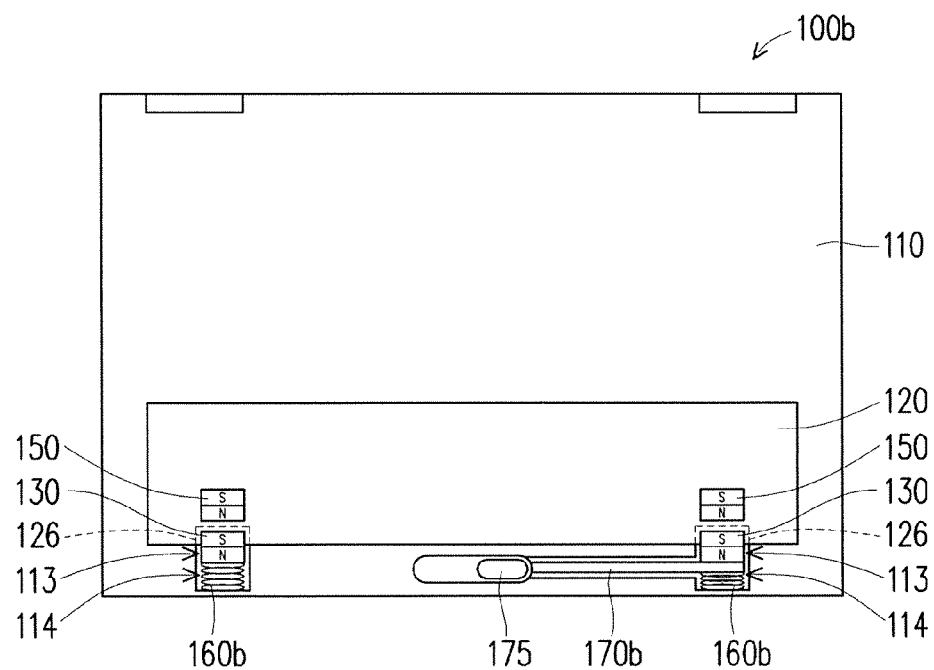
FIG. 4A to FIG. 4C are schematic views of the first magnetic component of the first body of the portable electronic device according to FIG. 3A being stopped, space-allowed, and moved by the stopper.
Figure 4B:
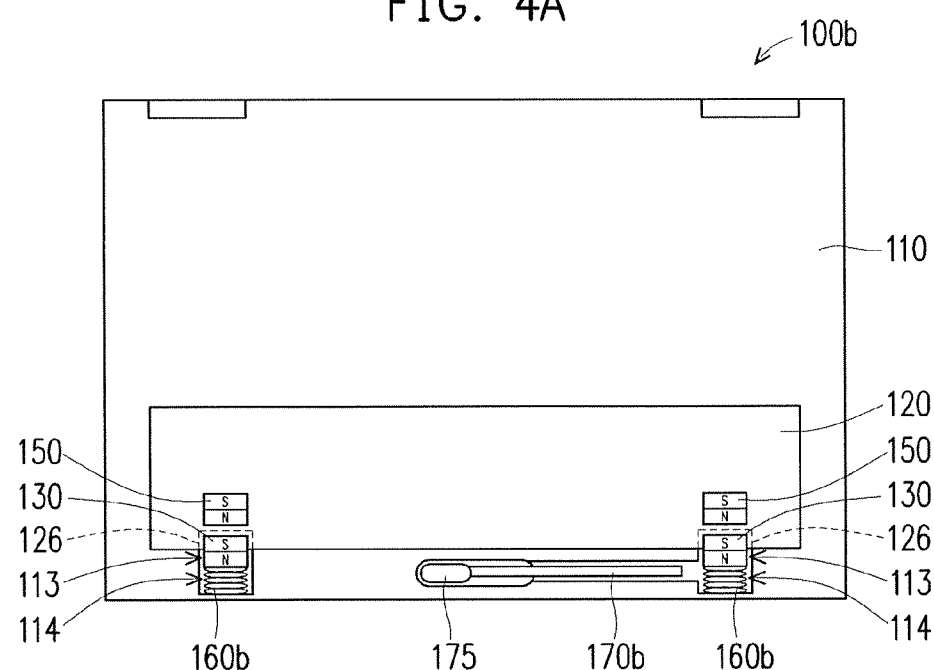
Figure 4C:
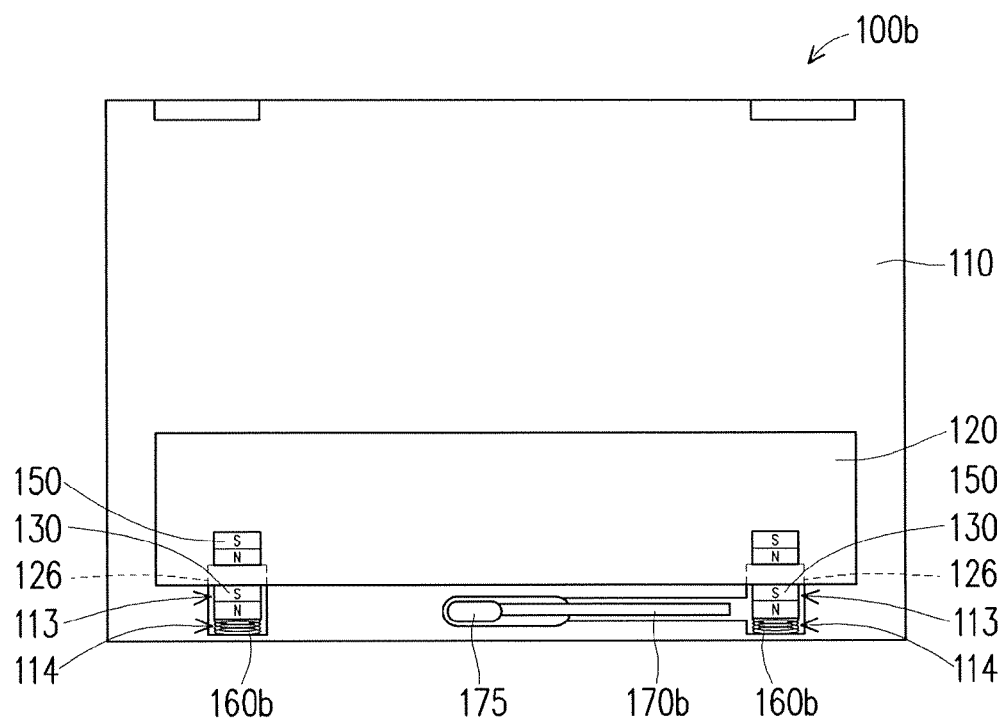

In addition, the type and operation of the stopper 170 are not limited to FIG. 1G to FIG. 1I. FIG. 4A to FIG. 4C are schematic views of the first magnetic component of the first body of the portable electronic device according to FIG. 3A being stopped, space-allowed, and moved by the stopper.

The main difference between the first body 100b in FIG. 4A to FIG. 4C and the first body 100 in FIG. 1G to FIG. 1I lies in the type of the stopper 170. As illustrated in FIG. 4A, in the embodiment, the number of the stopper 170b is one, the stopper 170b is a pole only extending into one of the first trenches 113 (the first trench 113 on the right side of the diagram is illustrated in the embodiment, but the invention is not limited thereto), and the elastic component 160b is disposed in the second trench 114. In FIG. 4A, the stopper 170b extends into the first trench 113 to restrict the sliding space of the first magnetic component 130 in the first trench 113, so as to make the first magnetic component 130 not exit the notch 126.

When the user needs to use the function of the supporter 120, as long as moving the button 175, as illustrated in FIG. 4B, the stopper 170b exits the first trench 113. At this time, the elastic component 160b is able to be linked to the first magnetic component 130. As illustrated in FIG. 4C, the first magnetic component 130 compresses the elastic component 160b, able to move downward and exit the notch 126 of the supporter 120.

Figure 5A:
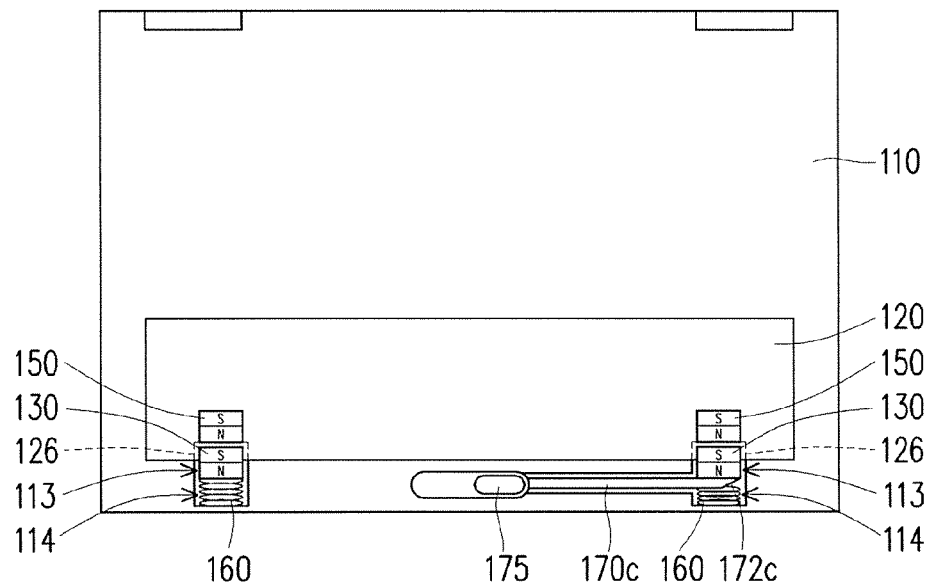
FIG. 5A to FIG. 5C are schematic views of the first magnetic component of the first body of the portable electronic device being stopped, space-allowed, and moved by the stopper according to another embodiment of the invention.
Figure 5B:
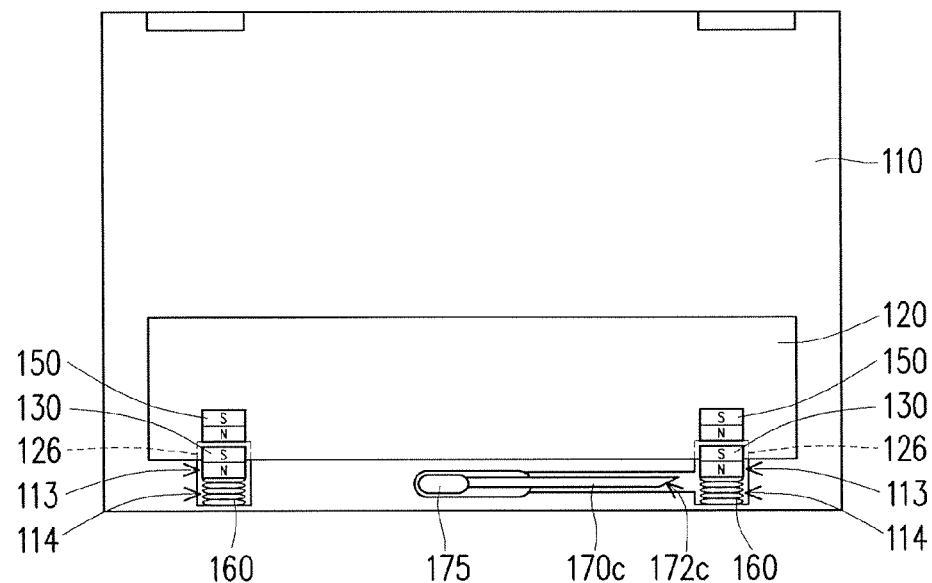
Figure 5C:
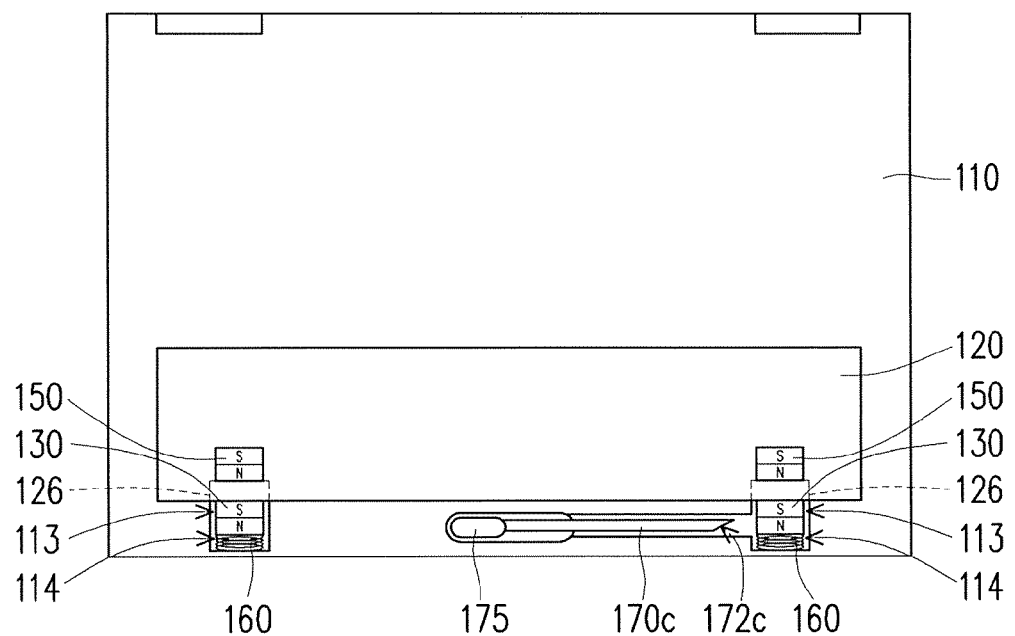

FIG. 5A to FIG. 5C are schematic views of the first magnetic component of the first body of the portable electronic device being stopped, space-allowed, and moved by the stopper according to another embodiment of the invention. Please referring to FIG. 5A to FIG. 5C, the main difference between the embodiment and the previous embodiment lies in that the portion of the stopper 170c extending into the first trench 113 has a lead angle 172c, makes it easier to be inserted between the first magnetic component 130 and the elastic component 160.

Similarly, in FIG. 5A, the stopper 170c extends into the first trench 113 to restrict the sliding space of the first magnetic component 130 in the first trench 113, so as to make the first magnetic component 130 not exit the notch 126. When the user needs to use the function of the supporter 120, as long as moving the button 175, as illustrated in FIG. 5B, the stopper 170c exits the first trench 113. At this time, the elastic component 160 is able to be linked to the first magnetic component 130. As illustrated in FIG. 5C, the first magnetic component 130 compresses the elastic component 160, able to move downward and exit the notch 126 of the supporter 120.

Figure 6A:
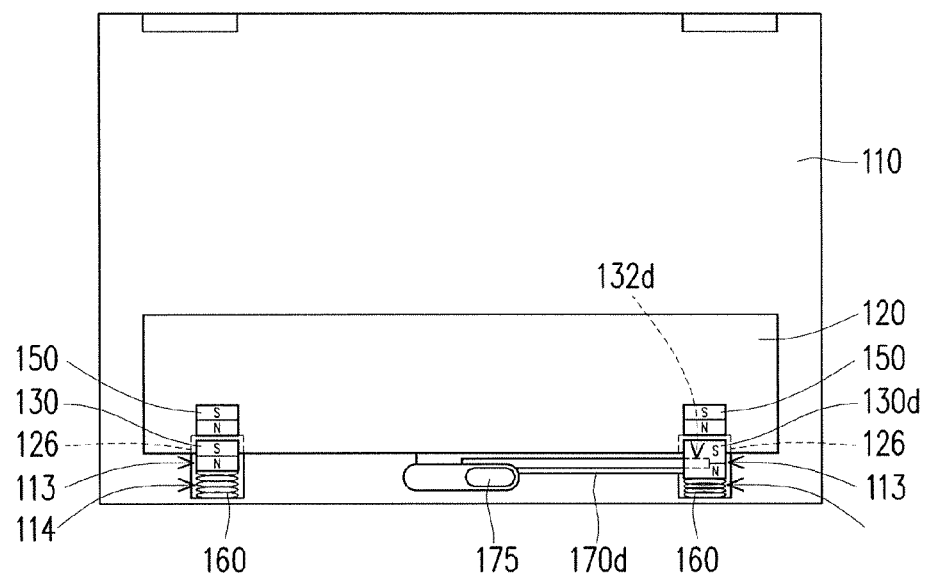
FIG. 6A to FIG. 6C are schematic views of the first magnetic component of the first body of the portable electronic device being stopped, space-allowed, and moved by the stopper according to another embodiment of the invention.
Figure 6B:
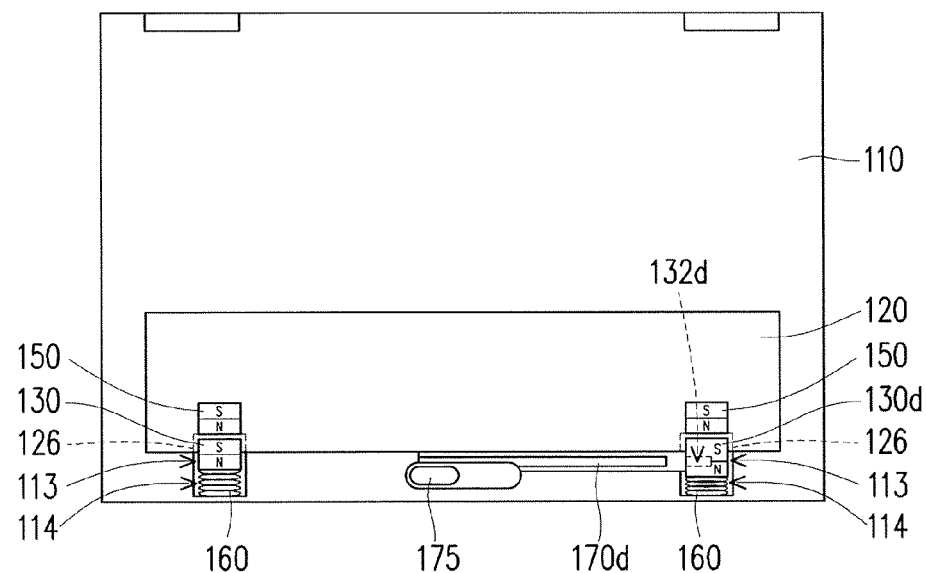
Figure 6C:
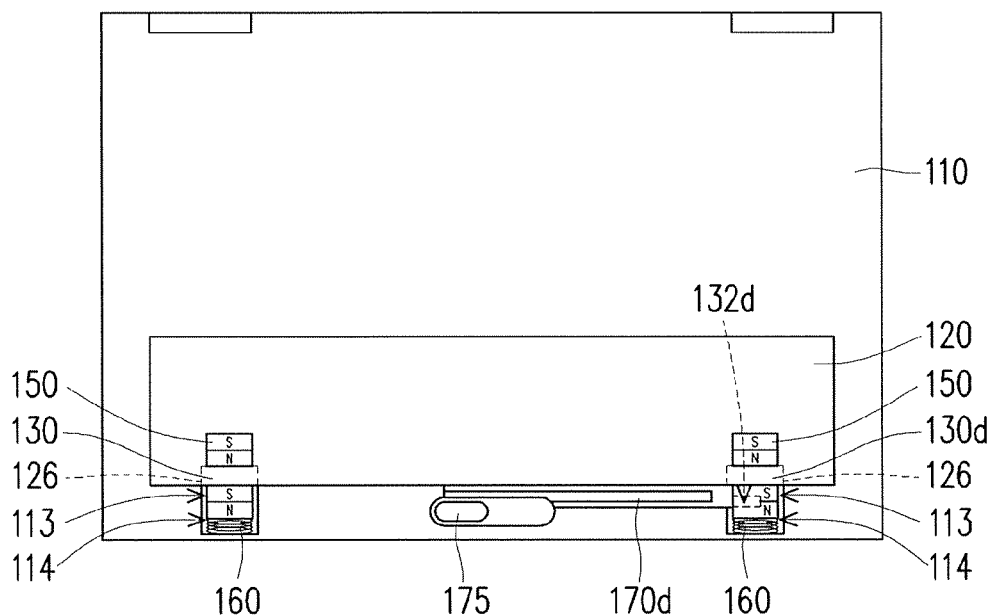

FIG. 6A to FIG. 6C are schematic views of the first magnetic component of the first body of the portable electronic device being stopped, space-allowed, and moved by the stopper according to another embodiment of the invention. Please referring to FIG. 6A to FIG. 6C, the main difference between the embodiment and the embodiment in FIG. 4A to 4C lies in that in the embodiment, the first magnetic component 130d includes a cavity 132d, and the stopper 170d extends into the cavity 132d of the first magnetic component 130d and not the slit between the first magnetic component 130d and the elastic component 160.

In FIG. 6A, the stopper 170d extends into the cavity 132d of the first magnetic component 130d, so that the first magnetic component 130d can't be moved relative to the stopper 170d. As a result, the first magnetic component 130d doesn't exit the notch 126. When the user needs to use the function of the supporter 120, as long as moving the button 175, as illustrated in FIG. 6B, the stopper 170d exit the cavity 132d of the first magnetic component 130d. At this time, the first magnetic component 130d is able to receive the magnetic force of the second magnetic component 210 (illustrated in FIG. 1E) of the second body 200 to move downward and compress the elastic component 160 as illustrated in FIG. 6C, and the first magnetic component 130d is able to exit the notch 126 of the supporter 120 consequently.

Figure 7A:
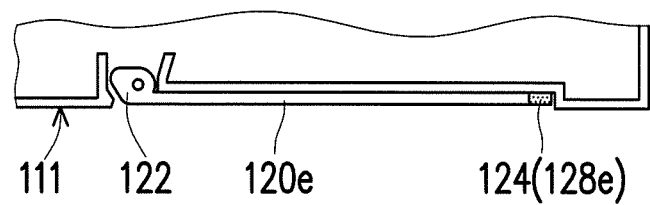
FIG. 7A to FIG. 7B are schematic views illustrating various supporters of the first body of the portable electronic device according to other embodiments of the invention.
Figure 7B:
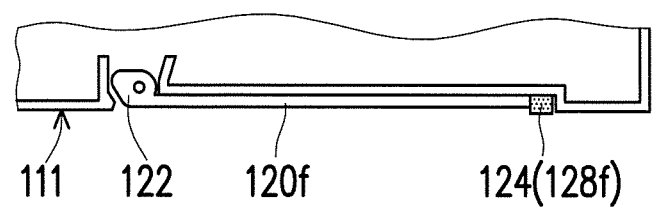

In addition, the type of the supporter 120 is not limited thereto. FIG. 7A to FIG. 7B are schematic views illustrating various supporters of the first body of the portable electronic device according to other embodiments of the invention. Please referring to FIG. 7A, in the embodiment, the second lateral 124 of the supporter 120e includes a slip-stopping portion 128e, which is able to make the second lateral 124 of the supporter 120e provide the slip-stopping effect when it is in contact with the second body 200 (illustrated in FIG. 1F).

Please referring to FIG. 7B, the main difference between the supporter 120f in FIG. 7B and the supporter 120e in FIG. 7A lies in that, in FIG. 7A, the lower surface of the slip-stopping portion 128e is in alignment with or slightly sunk into the lower surface of other portions of the supporter 120e. In FIG. 7B, the lower surface of the slip-stopping portion 128f protrudes from the lower surface of other portions of the supporter 120f. This design can make the slip-stopping portion 128f contact the desk-top so that the portable electronic device can achieve the slip-stopping effect when the portable electronic device is used as a normal notebook PC.

Figure 7C:
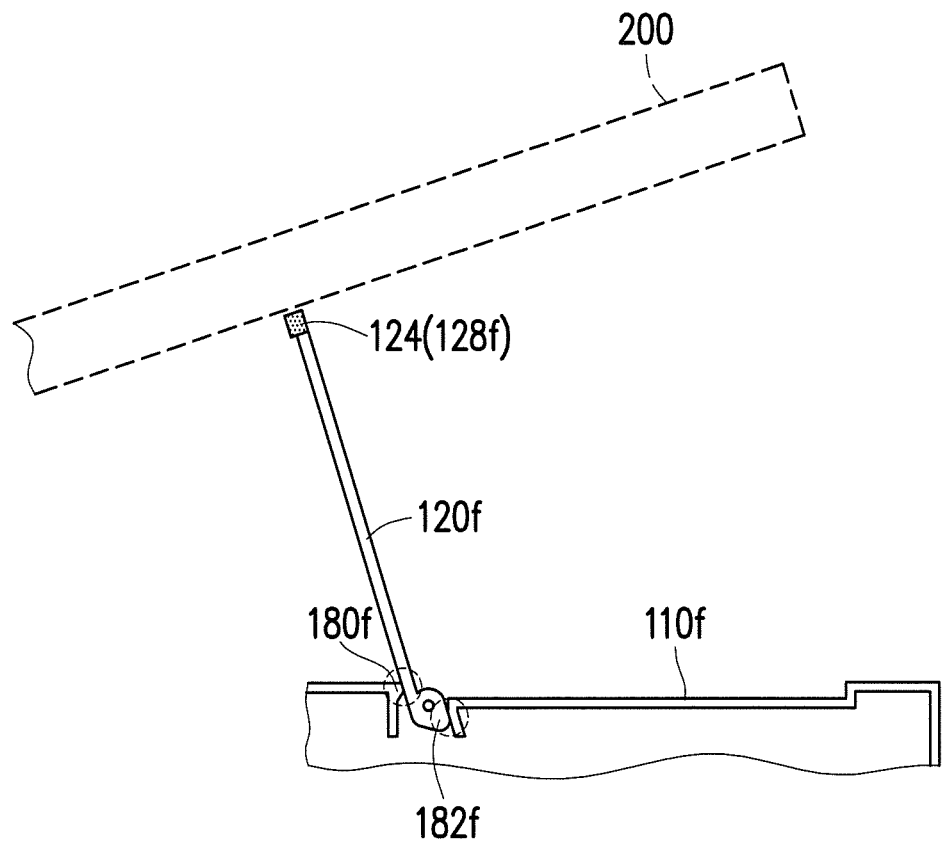
FIG. 7C is partial schematic view of the supporter according to FIG. 7B supporting the second body.

FIG. 7C is partial schematic view of the supporter 120f according to FIG. 7B supporting the second body 200. Please referring to FIG. 7C, in the embodiment, the first lateral 122 of the supporter 120f and the casing 110f at a position close to where the first lateral 122 of the supporter 120f is pivoted to the casing 110 includes two position-limiting portions 182f, 180f respectively. As illustrated in FIG. 7C, when the second lateral 124 of the supporter 120f is rotated out, the position-limiting portion 180f of the casing 110f may interfere with the supporter 120f, and the position-limiting portion 182f of the supporter 120f may interfere with the casing 110f, so as to restrict the rotation range of the supporter 120f relative to the casing 110f.

Figure 7D:
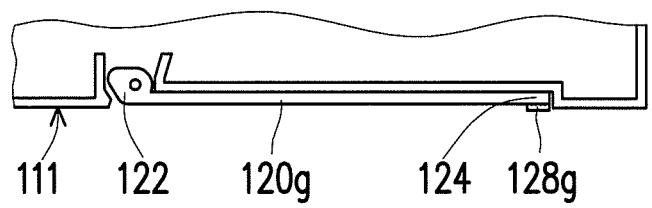
FIG. 7D is schematic view illustrating the supporter of the first body of a portable electronic devices according to other embodiments of the invention.

FIG. 7D is schematic view illustrating the supporter of the first body of a portable electronic devices according to other embodiments of the invention. The main difference between the supporter 120g in FIG. 7D and the supporter 120f in FIG. 7B lies in that in FIG. 7D, the slip-stopping portion 128g is only disposed on the lower surface of the second lateral 124 of the supporter 120g, so that the slip-stopping portion 128g may contact the desk-top and make the portable electronic device achieve the slip-stopping effect when the portable electronic device is used as a normal PC.

Figure 8:
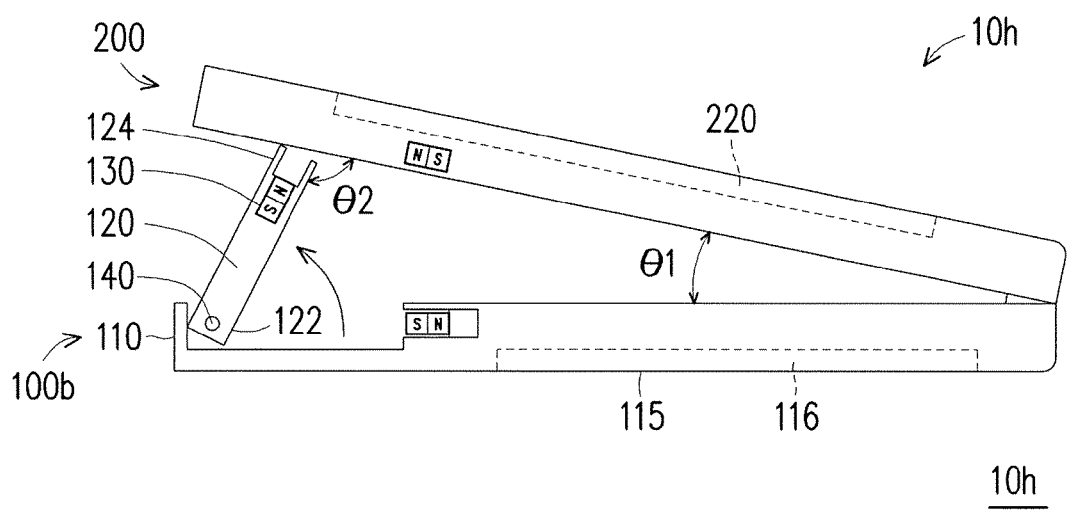
FIG. 8 is the cross-sectional schematic view of the supporter of a portable electronic device according to an embodiment of the invention supporting the second body.

FIG. 8 is the cross-sectional schematic view of the supporter of a portable electronic device according to an embodiment of the invention supporting the second body. Please referring to FIG. 8, the main difference between the portable electronic device 10h in FIG. 8 and the portable electronic device 10 in FIG. 1F lies in the rotation direction of the supporter 120. In FIG. 1F, the first lateral 122 of the supporter 120 is closer to the pivot pivoted to the first body 100 and the second body 200 in comparison with the second lateral 124, and the supporter 120 is rotated in a clockwise direction. That is, the first lateral 122 of the supporter 120 is closer to the right side of the figure, and the second lateral 124 located on the left side of the figure is rotated in a clockwise direction when it is rotated upward. In FIG. 8, the first lateral 122 of the supporter 120 is further away from the pivot pivoted to the first body 100 and the second body 200 in comparison with the second lateral 124, and the supporter 120 is rotated in a counterclockwise direction. That is, the first lateral 122 of the supporter 120 is closer to the left side of the figure, and the second lateral 124 located on the right side of the figure is rotated in a counterclockwise direction when it is rotated upward.

Of course, as long as the supporter 120 can be flipped up and support the second body 200, there is no need to concern the rotation direction (clockwise or counterclockwise) of the supporter 120. In a preferred embodiment, when the second lateral 124 of the supporter 120 rotates out of the accommodating trench 112 and supports the second body 200, an angle $\theta 1$ between the first body 100 and the second body 200 is between 17 degrees and 22 degrees, and an angle $\theta 2$ between the supporter 120 and the second body 200 is between 85 degrees and 95 degrees. As a result, a more comfortable using state is provided to the user.

Based on the above, the first body of the portable electronic device of the invention includes a supporter pivoted to the casing through the torsion component, a first magnetic component able to extend into the notch of the supporter, and the second body includes the second magnetic component. When the supporter is located in the accommodating trench and the first magnetic component of the first body extends into the notch of the supporter, the supporter is positioned inside the accommodating trench by the first magnetic component, and the torsion component stores elastic potential energy. When the supporter is going to be rotated out, as long as the second body is rotated close to the first surface of the first body, and the first magnetic component exits the notch due to a magnetic repulsive force of the second magnetic component so that a position-limiting relationship between the first magnetic component and the supporter is removed, then the torsion component can consequently release the elastic potential energy so that the second lateral of the supporter is rotated out to support the second body.

It will be apparent to those skilled in the art that various modifications and variations can be made to the disclosed embodiments without departing from the scope or spirit of the invention. In view of the foregoing, it is intended that the invention covers modifications and variations provided that they fall within the scope of the following claims and their equivalents.

What is claimed is:

1. A portable electronic device, comprising:
    a first body comprising:
        a casing, comprising a first surface, an accommodating trench sunk into the first surface, and a first trench communicated with the accommodating trench;
        a supporter, comprising a first lateral and a second lateral opposite to each other, wherein the first lateral is pivoted to the casing through a torsion component, the supporter is adapted to be accommodated in the accommodating trench, and the second lateral comprises a notch;
        a first magnetic component, slidably disposed on the first trench and adapted to extends into the notch; and
    a second body, pivoted to the first body and comprises a second magnetic component, wherein when the supporter is located in the accommodating trench and the first magnetic component extends into the notch, the supporter is positioned inside the accommodating trench by the first magnetic component, and the torsion component stores an elastic potential energy,
    and when the second body is rotated close to the first surface of the first body, the first magnetic component exits the notch due to a magnetic repulsive force of the second magnetic component so that the supporter is not positioned by the first magnetic component, and the torsion component releases the elastic potential energy so that the second lateral of the supporter is rotated out to support the second body.

2. The portable electronic device according to claim 1, wherein the first body further comprising:
    a third magnetic component, disposed on the supporter and close to the notch, the third magnetic component is adapted to magnetically attract the first magnetic component so that the first magnetic component extends into the notch.

3. The portable electronic device according to claim 1, wherein the first body further comprising:
    a third magnetic component, disposed in the casing and close to the accommodating trench, the third magnetic component is adapted to magnetically attract the first magnetic component so that the first magnetic component extends into the notch.

4. The portable electronic device according to claim 1, wherein the first body further comprising:
    an elastic component, disposed in the first trench and linked to the first magnetic component, the first magnetic component is adapted to compress the elastic component so as to exit the notch.

5. The portable electronic device according to claim 1, wherein the casing comprises a second trench communicated with the first trench, and the first body further comprises:
    a stopper, slidably disposed on the second trench and adapted to extend into the first trench to restrict a sliding space of the first magnetic component inside the first trench so as to prevent the first magnetic component from exiting the notch.

6. The portable electronic device according to claim 5, wherein the first magnetic component comprises a cavity, and the stopper is adapted to extend into the cavity.

7. The portable electronic device according to claim 5, wherein a portion of the stopper extending into the first trench has a lead angle.

8. The portable electronic device according to claim 1, wherein the second lateral of the supporter comprises a slip-stopping portion.

9. The portable electronic device according to claim 1, wherein the first lateral of the supporter or the casing at a position close to where the first lateral of the supporter is pivoted to the casing comprises a position-limiting portion, so as to restrict a rotation range of the supporter relative to the casing.

10. The portable electronic device according to claim 1, wherein when the second lateral of the supporter is rotated out of the accommodating trench and supports the second body, an angle between the first body and the second body is between 17 degrees and 22 degrees, and an angle between the supporter and the second body is between 85 degrees and 95 degrees.

11. The portable electronic device according to claim 1, wherein the first body comprises a second surface opposite to the first surface, the first body is adapted to be rotated relative to the second body, so that the second surface of the first body contacts the second body.

12. The portable electronic device according to claim 1, wherein the first lateral of the supporter is closer to a pivot pivoted to the first body and the second body in comparison with the second lateral, or, the first lateral of the supporter is further away from the pivot pivoted to the first body and the second body in comparison with the second lateral.

13. The portable electronic device according to claim 1, wherein the second lateral of the supporter is rotated out in a clockwise direction, or, the second lateral of the supporter is rotated out in a counterclockwise direction.

* * * * *